US012562233B2

(12) United States Patent
Bonitz

(10) Patent No.: US 12,562,233 B2
(45) Date of Patent: Feb. 24, 2026

(54) MEMORY DEVICE WEAR LEVELING

(71) Applicant: Micron Technology, Inc., Boise, ID (US)

(72) Inventor: Rainer Frank Bonitz, Bruckmühl (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/655,700

(22) Filed: May 6, 2024

(65) Prior Publication Data

US 2024/0290406 A1      Aug. 29, 2024

Related U.S. Application Data

(63) Continuation of application No. 17/659,897, filed on Apr. 20, 2022, now Pat. No. 12,009,038.

(51) Int. Cl.
| | |
|---|---|
| *G11C 16/10* | (2006.01) |
| *G11C 16/04* | (2006.01) |
| *G11C 16/16* | (2006.01) |
| *G11C 16/26* | (2006.01) |
| *G11C 16/34* | (2006.01) |

(52) U.S. Cl.
CPC ........ *G11C 16/349* (2013.01); *G11C 16/0483* (2013.01); *G11C 16/16* (2013.01); *G11C 16/26* (2013.01); *G11C 16/345* (2013.01)

(58) Field of Classification Search
CPC ... G11C 16/349; G11C 16/0483; G11C 16/16; G11C 16/26; G11C 16/345
See application file for complete search history.

(56) References Cited

U.S. PATENT DOCUMENTS

| | | | | |
|---|---|---|---|---|
| 10,489,064 | B2 * | 11/2019 | McClain | ............... G06F 3/0616 |
| 12,009,038 | B2 * | 6/2024 | Bonitz | .................. G11C 29/42 |
| 2011/0271043 | A1 | 11/2011 | Segal et al. | |
| 2013/0311703 | A1 | 11/2013 | Cheng et al. | |
| 2014/0075100 | A1 * | 3/2014 | Kaneko | ............... G06F 12/0246 |
| | | | | 711/103 |
| 2015/0058530 | A1 * | 2/2015 | Reddy | ................... G06F 3/0679 |
| | | | | 711/103 |
| 2017/0046256 | A1 * | 2/2017 | Horspool | .............. G06F 3/0689 |
| 2019/0050153 | A1 | 2/2019 | Yang et al. | |
| 2020/0241765 | A1 | 7/2020 | Yang et al. | |
| 2021/0042236 | A1 | 2/2021 | Cariello | |
| 2022/0137829 | A1 * | 5/2022 | Lee | ..................... G06F 11/1076 |
| | | | | 711/114 |

(Continued)

*Primary Examiner* — Mushfique Siddique
(74) *Attorney, Agent, or Firm* — Harrity & Harrity, LLP

(57)      ABSTRACT

A controller of a memory device may determine that an endurance parameter associated with a wear leveling pool of a memory of the memory device satisfies a threshold. The wear leveling pool includes a plurality of memory blocks of the memory. The controller may divide, based on determining that the endurance parameter satisfies the threshold, the plurality of memory blocks of the wear leveling pool into a first wear leveling pool subset that includes a first subset of the plurality of memory blocks and a second wear leveling pool subset that includes a second subset of the plurality of memory blocks. A first subset of a plurality of data partitions is stored in the first subset of the plurality of memory blocks, and a second subset of the plurality of data partitions is stored in the second subset of the plurality of memory blocks.

20 Claims, 13 Drawing Sheets

300

(56)                    References Cited

U.S. PATENT DOCUMENTS

| | | | |
|---|---|---|---|
| 2023/0152995 A1* | 5/2023 | Doni | G06F 3/0659 |
| | | | 711/154 |
| 2023/0205425 A1 | 6/2023 | Cariello | |
| 2023/0343402 A1 | 10/2023 | Bonitz | |

* cited by examiner

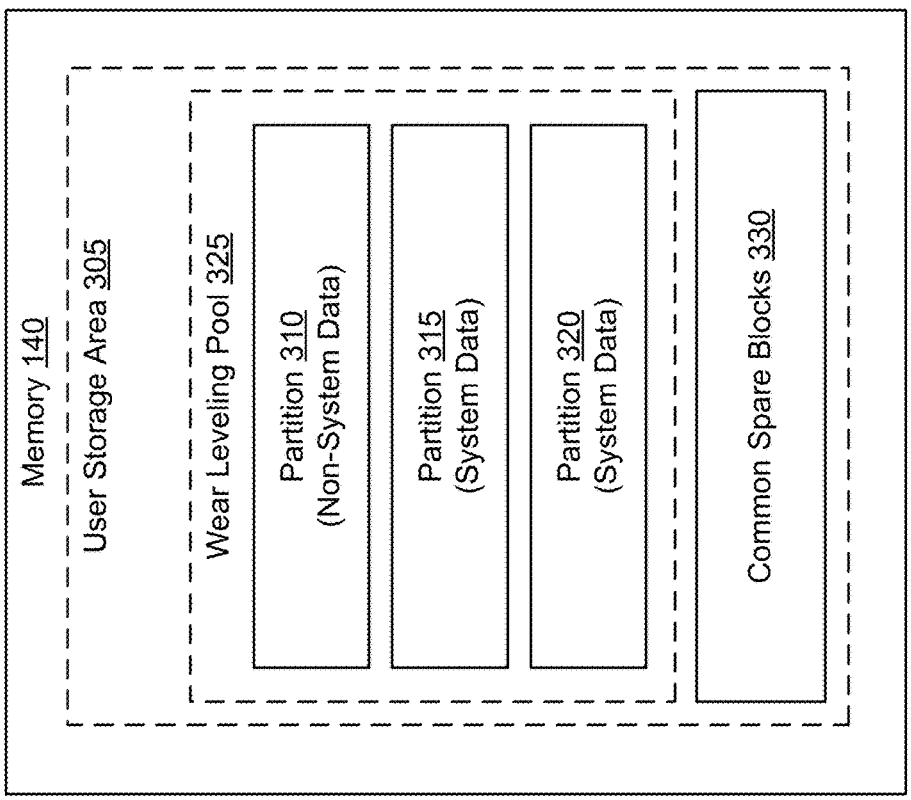
Memory 140
User Storage Area 305
Wear Leveling Pool 325
Partition 310
(Non-System Data)
Partition 315
(System Data)
Partition 320
(System Data)
Common Spare Blocks 330
FIG. 4A
120
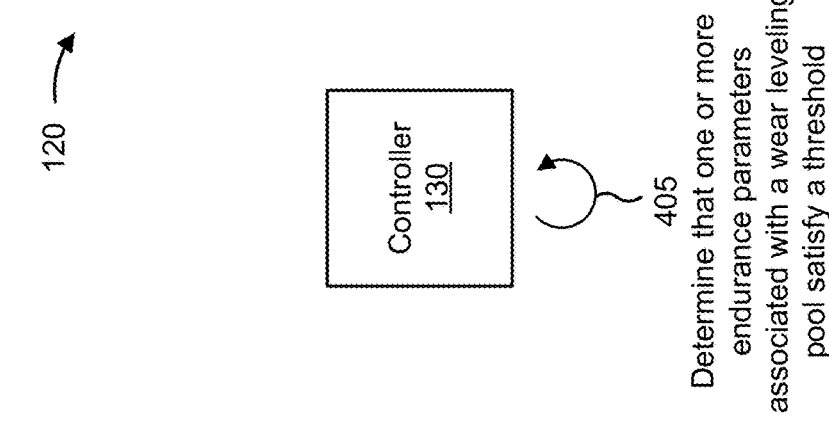
Controller
130
405
Determine that one or more
endurance parameters
associated with a wear leveling
pool satisfy a threshold
400

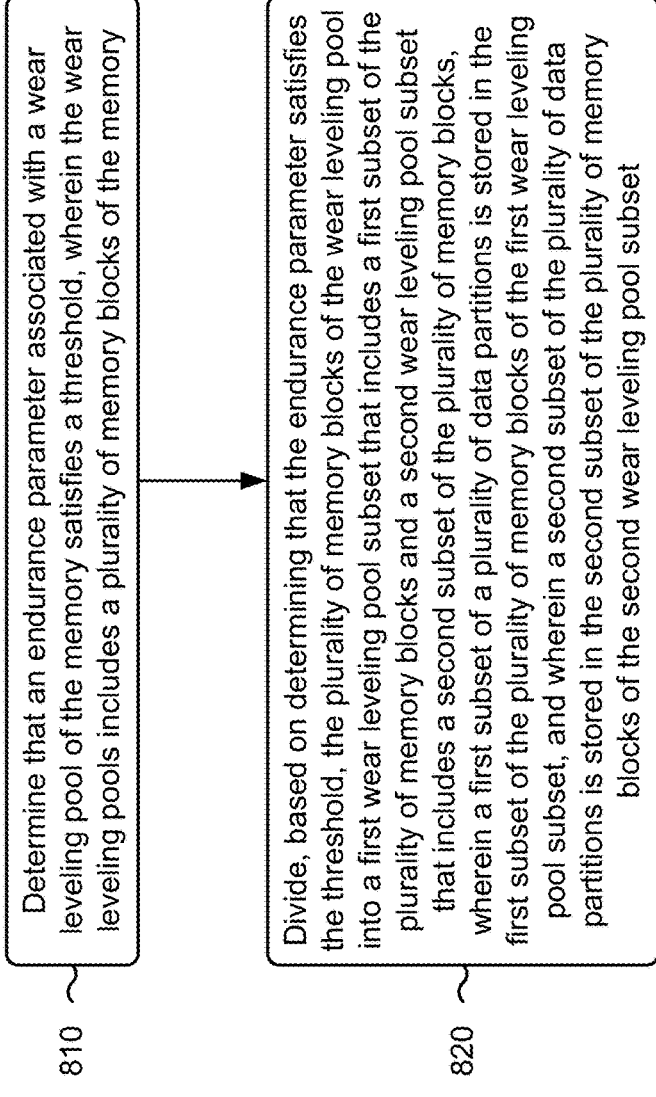

Determine that an endurance parameter associated with a wear leveling pool of the memory satisfies a threshold, wherein the wear leveling pools includes a plurality of memory blocks of the memory

810

Divide, based on determining that the endurance parameter satisfies the threshold, the plurality of memory blocks of the wear leveling pool into a first wear leveling pool subset that includes a first subset of the plurality of memory blocks and a second wear leveling pool subset that includes a second subset of the plurality of memory blocks, wherein a first subset of a plurality of data partitions is stored in the first subset of the plurality of memory blocks of the first wear leveling pool subset, and wherein a second subset of the plurality of data partitions is stored in the second subset of the plurality of memory blocks of the second wear leveling pool subset

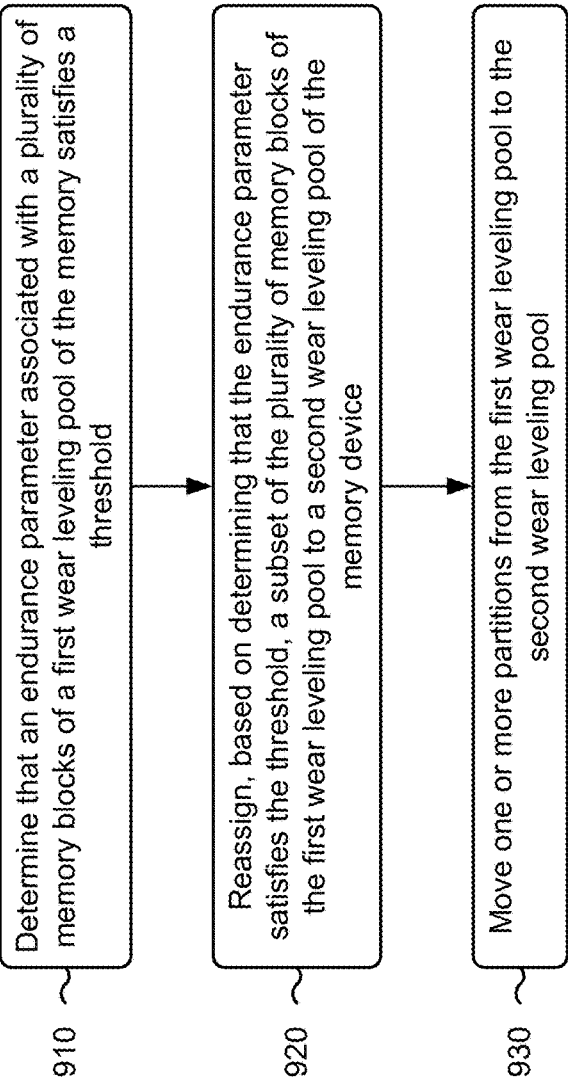

Determine that an endurance parameter associated with a plurality of memory blocks of a first wear leveling pool of the memory satisfies a threshold Reassign, based on determining that the endurance parameter satisfies the threshold, a subset of the plurality of memory blocks of the first wear leveling pool to a second wear leveling pool of the memory device Move one or more partitions from the first wear leveling pool to the second wear leveling pool

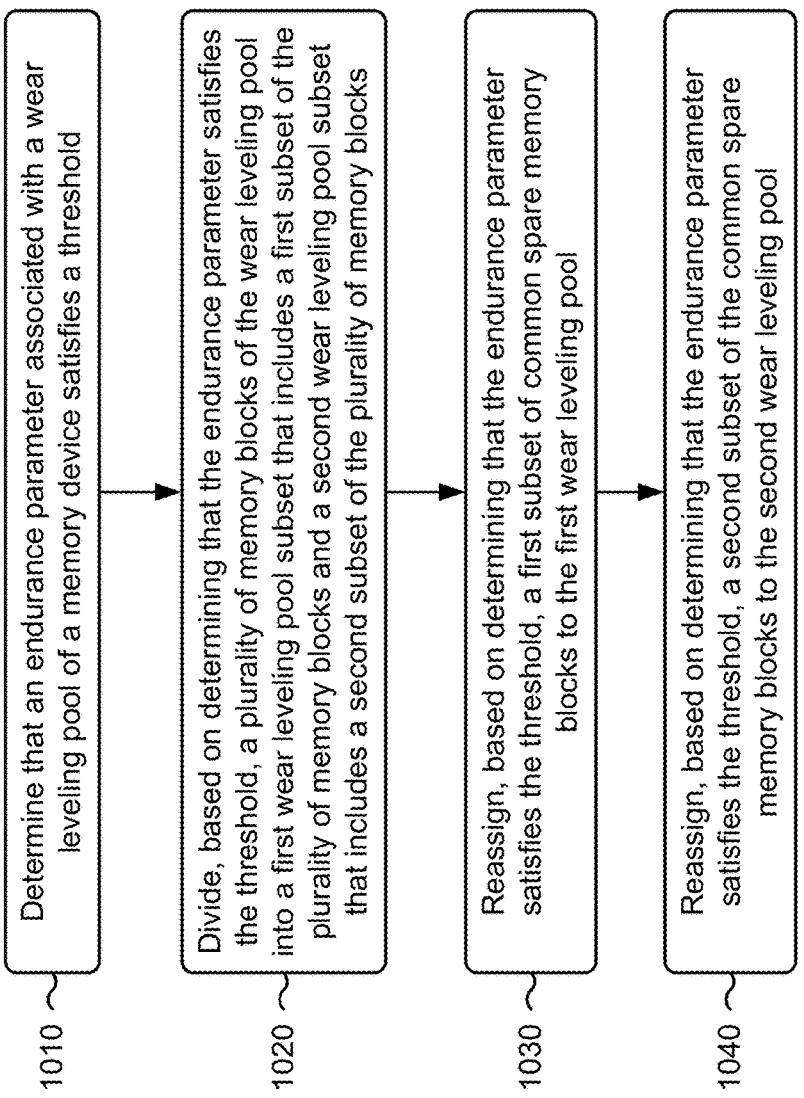

Determine that an endurance parameter associated with a wear leveling pool of a memory device satisfies a threshold

1010

Divide, based on determining that the endurance parameter satisfies the threshold, a plurality of memory blocks of the wear leveling pool into a first wear leveling pool subset that includes a first subset of the plurality of memory blocks and a second wear leveling pool subset that includes a second subset of the plurality of memory blocks

1020

Reassign, based on determining that the endurance parameter satisfies the threshold, a first subset of common spare memory blocks to the first wear leveling pool

1030

Reassign, based on determining that the endurance parameter satisfies the threshold, a second subset of the common spare memory blocks to the second wear leveling pool

MEMORY DEVICE WEAR LEVELING

RELATED APPLICATION

This application is a continuation of U.S. patent application Ser. No. 17/659,897, filed Apr. 20, 2022, which is incorporated herein by reference in its entirety.

TECHNICAL FIELD

The present disclosure generally relates to memory devices, memory device operations, and, for example, to memory device wear leveling.

BACKGROUND

A non-volatile memory device, such as a NAND memory device, may use circuitry to enable electrically programming, erasing, and storing of data even when a power source is not supplied. Non-volatile memory devices may be used in various types of electronic devices, such as computers, mobile phones, or automobile computing systems, among other examples.

A non-volatile memory device may include an array of memory cells, a page buffer, and a column decoder. In addition, the non-volatile memory device may include a control logic unit (e.g., a controller), a row decoder, or an address buffer, among other examples. The memory cell array may include memory cell strings connected to bit lines, which are extended in a column direction.

A memory cell, which may be referred to as a "cell" or a "data cell," of a non-volatile memory device may include a current path formed between a source and a drain on a semiconductor substrate. The memory cell may further include a floating gate and a control gate formed between insulating layers on the semiconductor substrate. A programming operation (sometimes called a write operation) of the memory cell is generally accomplished by grounding the source and the drain areas of the memory cell and the semiconductor substrate of a bulk area, and applying a high positive voltage, which may be referred to as a "program voltage," a "programming power voltage," or "VPP," to a control gate to generate Fowler-Nordheim tunneling (referred to as "F-N tunneling") between a floating gate and the semiconductor substrate. When F-N tunneling is occurring, electrons of the bulk area are accumulated on the floating gate by an electric field of VPP applied to the control gate to increase a threshold voltage of the memory cell.

An erasing operation of the memory cell is concurrently performed in units of sectors sharing the bulk area (referred to as "blocks" or "memory blocks"), by applying a high negative voltage, which may be referred to as an "erase voltage" or "$V_{era}$," to the control gate and a configured voltage to the bulk area to generate the F-N tunneling. In this case, electrons accumulated on the floating gate are discharged into the source area, so that the memory cells have an erasing threshold voltage distribution.

Each memory cell string may have a plurality of floating gate type memory cells serially connected to each other. Access lines (sometimes called "word lines") are extended in a row direction, and a control gate of each memory cell is connected to a corresponding access line. A non-volatile memory device may include a plurality of page buffers connected between the bit lines and the column decoder. The column decoder is connected between the page buffer and data lines.

BRIEF DESCRIPTION OF THE DRAWINGS

FIGS. 3, 4A-4B, 5, 6, and 7A-7C are diagrams illustrating examples of memory device wear leveling.

FIGS. 8-10 are flowcharts of example methods associated with memory device wear leveling.

DETAILED DESCRIPTION

Figure 1:
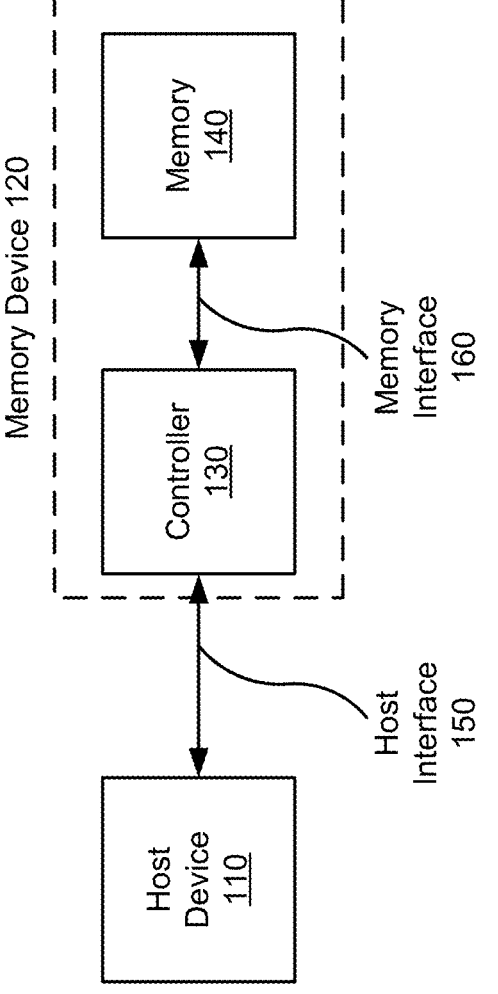
FIG. 1 is a diagram illustrating an example system capable of wear leveling in a memory device.

Some types of memory may have endurance limits regarding a quantity of access operations (e.g., write operations, read operations, program operations, and/or erase operations) that may be performed on a memory cell before memory performance is reduced and/or failure starts to occur. For example, physical degradation of a memory cell (e.g., a flash memory cell or an electrically erasable programmable read only memory (EEPROM) cell, among other examples) may occur as access operations for the memory cell are accumulated. This physical degradation can lead to decreased memory performance and/or memory cell failure for the memory cell. In particular, the memory cell may wear out or stop reliably storing a memory state due to physical degradation once a sufficient quantity of access operations is accumulated.

In a memory device, some memory blocks of memory cells may be more frequently accessed relative to other memory blocks. This may lead to some memory cells degrading or wearing out more quickly than other memory cells. In some cases, some memory blocks of memory cells may be subjected to a higher concentration of access operations, for example, due to normal operations of a memory device or a malicious attack. Accordingly, some memory cells of a memory device may wear out before memory cells of other, less accessed, memory blocks. As such, logic states or data stored at those memory cells may become corrupted, and those memory cells may cease to reliably store logic states or data. In some use cases, such as automotive, the failure or wear out of memory cells can result in the loss of critical system data for an associated vehicle, which can render the vehicle non-operational and can result in costly repairs to the vehicle for replacing the memory device.

Some implementations described herein provide wear leveling techniques for wear leveling in a memory device. As described herein, memory blocks of a memory device may be configured as a wear leveling pool in which usage of the memory blocks is more evenly spread across the memory blocks to facilitate an even distribution of wear and an increased usage lifespan for the memory device. As access operations are accumulated, and the memory device approaches end of life (EOL), a controller of the memory device may divide or partition subsets of the memory blocks of the wear leveling pool into a wear leveling pool subsets. A subset of the memory blocks from the wear leveling pool may be allocated to a wear leveling pool subset that is used for storing data that is less critical and more frequently modified or updated, and another subset of the memory blocks from the wear leveling pool may be allocated to another wear leveling pool subset that is used for storing data that is more critical and less frequently modified or updated. In this way, data for critical functions of a vehicle that are not expected to change or are expected to change infrequently, such as a digital dashboard function, a safety system function, and/or a navigation function, may be stored together in dedicated memory blocks of a wear leveling pool subset such that these critical functions can be maintained for an increased lifespan than if the data for these critical functions were stored in memory blocks that were also used for non-critical functions or non-critical data. This may increase the useful life of the vehicle and may extend the time duration between repairs of the vehicle, among other examples.

FIG. 1 is a diagram illustrating an example system 100 capable of memory device wear leveling. The system 100 may include one or more devices, apparatuses, and/or components for performing operations described herein (e.g., for memory device wear leveling). For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

In some implementations, the host device 110 may be or may be included in a vehicle, and may be configured to display (or generate for display) an infotainment system of the vehicle, a digital dashboard of the vehicle, and/or a navigation system of the vehicle, among other examples. In some implementations, the host device 110 may be configured to provide smart or autonomous driving functionality for the vehicle, sensing functionality for the vehicle, and/or another functionality for the vehicle.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

In some implementations, the memory device 120 may be configured to store host data for the host device 110. The host data may include, for example, a file system and associated data for a digital dashboard of the vehicle, a file system and associated data for an infotainment system of the vehicle, a mapping database for a navigation system of the vehicle, and/or a point of interest (POI) database for the navigation system of the vehicle, among other examples. Moreover, the memory device 120 may be configured to provide user-accessible storage for user data, which may include storage for user files, audio and/or video recordings, and/or user contact data, among other examples.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components.

In some implementations, the memory 140 may include non-volatile memory configured to maintain stored data after the memory device 120 is powered off. For example, the memory 140 may include NAND memory or NOR memory. Additionally, or alternatively, the memory 140 may include volatile memory that requires power to maintain stored data and that loses stored data after the memory device 120 is powered off. For example, the memory 140 may include one or more latches and/or random-access memory (RAM), such as dynamic RAM (DRAM) and/or static RAM (SRAM).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

As indicated above, FIG. 1 is provided as an example. Other examples may differ from what is described with regard to FIG. 1.

Figure 2:
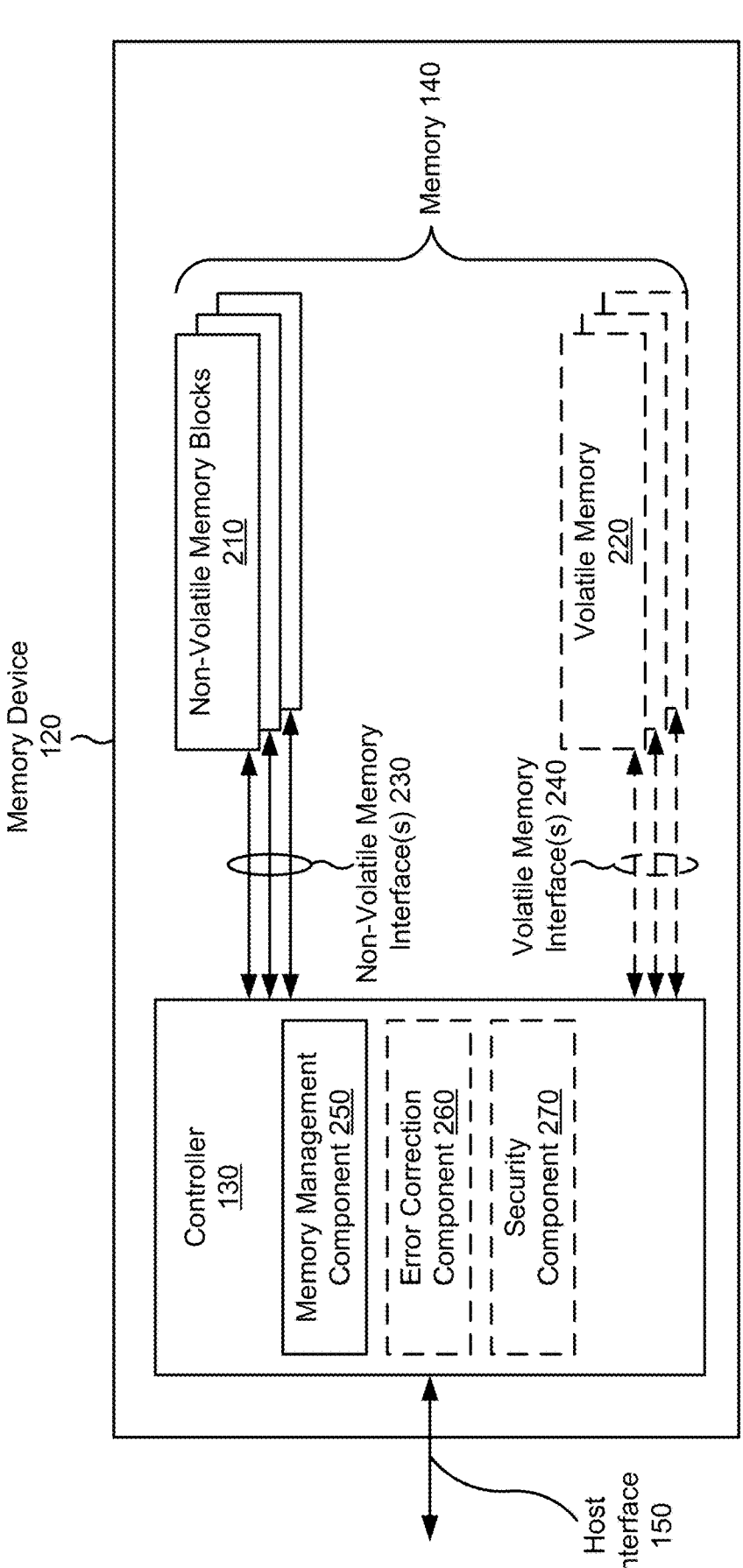
FIG. 2 is a diagram of example components included in a memory device.

FIG. 2 is a diagram of example components included in the memory device 120 of FIG. 1. As described above in connection with FIG. 1, the memory device 120 may include a controller 130 and memory 140. As shown in FIG. 2, the memory 140 may include a plurality of non-volatile memory blocks 210. The non-volatile memory blocks 210 may each include a plurality of physical memory cells and may be included in one or more memory arrays, such as one or more NAND memory arrays and/or one or more NOR memory arrays. The non-volatile memory blocks 210 may include flash memory cells, EEPROM cells, and/or another type of non-volatile memory cells. Additionally, or alternatively, the memory 140 may include volatile memory 220, which may include one or more SRAM arrays and/or one or more DRAM arrays. The controller 130 may transmit signals to and receive signals from a non-volatile memory block 210 using a non-volatile memory interface 230. The controller 130 may transmit signals to and receive signals from a volatile memory 220 using a volatile memory interface 240.

The volatile memory 220 may be used for functions such as caching or buffering of data that is to be written to the non-volatile memory blocks 210, caching or buffering of data read from the non-volatile memory blocks 210 (e.g., prior to providing the data to the host device 110), for storing and/or maintaining one or more mapping tables (e.g., logical to physical (L2P) mapping tables and/or another type of mapping tables) associated with the non-volatile memory blocks 210, storing parity information associated with the non-volatile memory blocks 210, and/or storing ECC information associated with the non-volatile memory blocks 210, among other examples.

Alternatively, the volatile memory 220 may be omitted from the memory device 120. A memory device 120 without volatile memory 220 may be referred to as a DRAM-less memory device or a RAM-less memory device. In these types of memory devices 120, the controller 130 may use a portion of the non-volatile memory blocks 210 for caching, buffering, and/or temporary storage. Additionally and/or alternatively, the host device 110 may allocate a portion of the volatile memory of the host device 110, which may be referred to as a host memory buffer (HMB), and the host device 110 may provide the memory device 120 with direct memory access (DMA) to the portion of the volatile memory of the host device 110 via the host interface 150. The controller 130 may access the portion of the volatile memory of the host device 110 (e.g., the HMB) and may use the portion of the volatile memory of the host device 110 for caching, buffering, and/or temporary storage, among other examples.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hard-wired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250. In some implementations, the controller 130 also includes an error correction component 260, a security component 270, and/or another component. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The error correction component 260 may be configured to detect and/or correct errors associated with the memory device 120. For example, the error correction component 260 may be configured to detect and/or correct an error associated with writing data to or reading data from one or more memory cells of a memory array, such as a single-bit error (SBE) or a multi-bit error (MBE).

The security component 270 may be configured to perform one or more security operations for the memory device 120. For example, the security component 270 may be configured to encrypt or decrypt data, such as data read from the memory 140 and/or data to be written to the memory 140. Additionally, or alternatively, the security component 270 may be configured to validate commands received from the host device 110, such as by validating a cryptographic signature of a command (e.g., using one or more cryptographic keys).

One or more devices or components shown in FIG. 2 may be used to carry out operations described elsewhere herein, such as one or more operations of FIGS. 3, 4A-4B, 5, 6, and/or 7A-7C and/or one or more process blocks of the methods of FIGS. 8-10. For example, the controller 130 and/or the memory management component 250 may perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
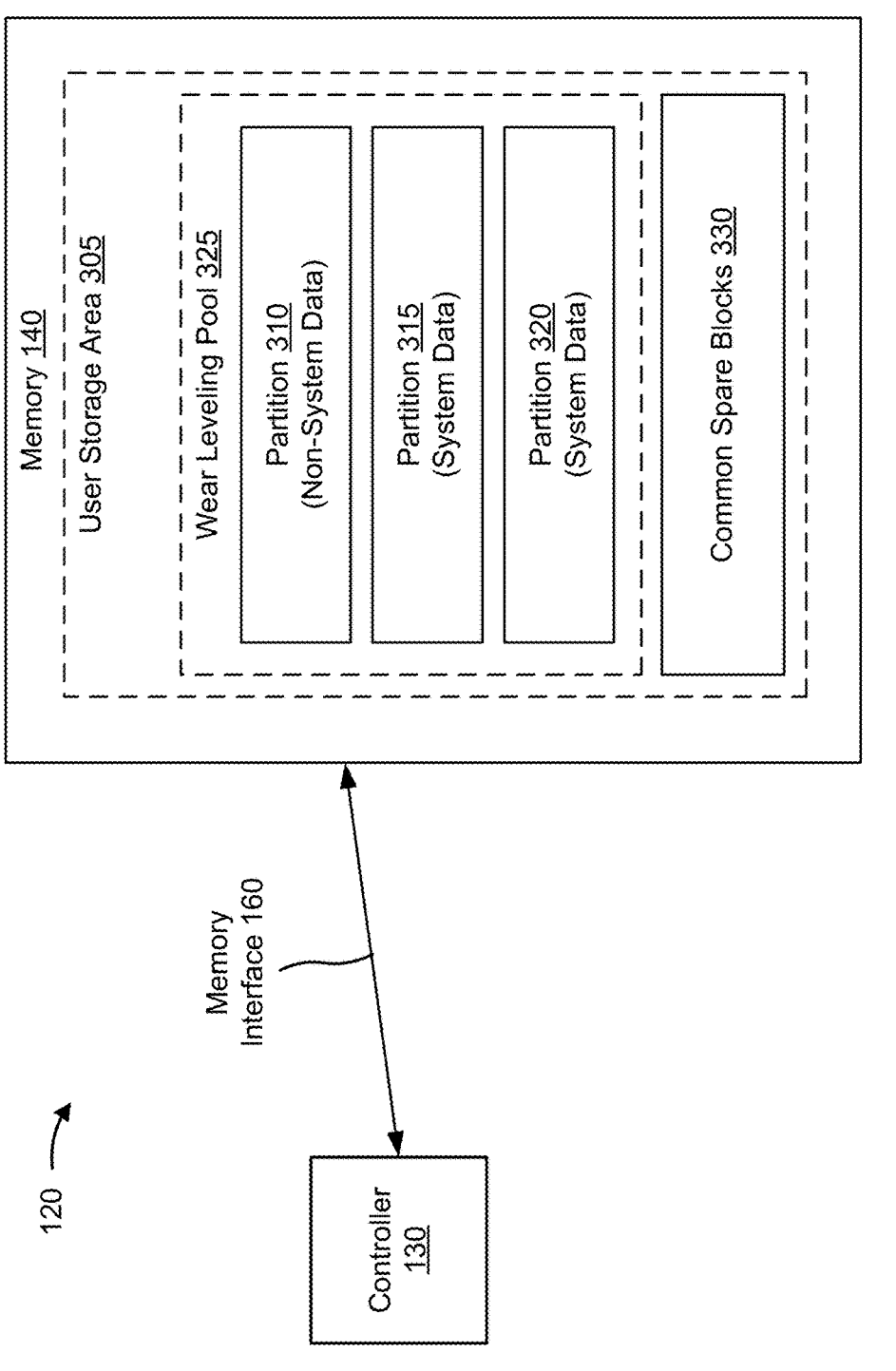

FIG. 3 is a diagram illustrating an example 300 of memory device wear leveling. As shown in FIG. 3, the example 300 may include the memory device 120, which includes the controller 130 and the memory 140. The controller 130 may access the memory 140 via the memory interface 160, as described herein.

As shown in FIG. 3, the controller may use the memory interface 160 to configure a user storage area 305 in the memory 140. The user storage area 305 may include at least a portion of the non-volatile memory blocks 210 of the memory 140 (e.g., all of the non-volatile memory blocks 210 or a subset of the non-volatile memory block 210). For example, the user storage area 305 may include the non-volatile memory blocks 210 of the memory 140 that are usable by the host device 110 (e.g., that are host-addressable). Other storage areas of the memory 140 may be configured for and/or dedicated for system usage of the memory device 120, and may not be accessible to or modified by the host device 110 (e.g., may be non-host-addressable).

The memory cells of the non-volatile memory blocks 210 allocated to the user storage area 305 may have one or more characteristics, attributes, and/or properties. For example, the memory cells may be configured and/or used as single level cells (SLCs) and/or multiple level cells (MLCs). An SLC memory cell refers to a memory cell that selectively stores data in one of two possible states, where each state is associated with a respective voltage level or another respective parameter (e.g., a respective resistance and/or a respective magnetism). Accordingly, an SLC memory cell is configured to store one bit of data. As used herein, "MLC" refers to the storage of greater than one bit per memory cell. MLC encompasses and/or includes double level cell (DLC) memory cells (e.g., cells that are configured to store two bits of data per memory cell), triple level cell (TLC) memory cells (e.g., cells that are configured to store three bits of data per memory cell), quadruple level cell (QLC) memory cells (e.g., cells that are configured to store four bits of data per memory cell), pentad level cell (PLC) memory cells (e.g., cells that are configured to store five bits of data per memory cell), and memory cells that are configured to store more than five bits of data per memory cell. As another example, the memory cells may be written to and/or read from to emphasize certain parameters, such as endurance, read speed, write speed, and/or data retention, among other examples.

As further shown in FIG. 3, a plurality of partitions 310-320 may be stored in non-volatile memory blocks 210 of the user storage area 305. The partitions 310-320 may include groups or partitions of the non-volatile memory blocks 210 of the user storage area 305. A partition may be associated with a logical unit number (LUN) or another type of logical identifier. A partition may be configured for storing specific types of data and/or or for general data storage. For example, a first partition 310 may be configured for storing non-system data of the host device 110, a second partition 315 may be configured for storing system data of the host device 110, a third partition 320 may be configured for storing system data of the host device 110, and so on. The quantity of partitions and the types of data stored in the partitions in the example 300 is an example, and other quantities and configurations are within the scope of the present disclosure.

Non-system data associated with the host device 110 may include, for example, user data, user applications or "apps," a file system and associated data associated with an operating system for providing the user applications, user files, audio and/or video recordings, contact data, and/or other types of non-critical user data. System data associated with the host device 110 may include data that is needed for the host device 110 (or a system in which the host device 110 is included, such as a vehicle) to properly function. For example, system data may include a file system and associated data for a digital dashboard or a digital instrumentation panel of a vehicle, a file system and associated data for an in-vehicle infotainment system of the vehicle, operating system data associated with the host device 110, a mapping database for a digital navigation system of the vehicle, a POI database for the navigation system of the vehicle, and/or another type of critical data for the host device 110, among other examples.

The partitions 310-320 may be stored in non-volatile memory blocks 210 of the memory 140 that are assigned to a wear leveling pool 325. The wear leveling pool 325 includes a plurality of non-volatile memory blocks 210, for the user storage area 305, to which the controller 130 applies a wear leveling algorithm. The wear leveling algorithm may be applied to achieve even and consistent wearing of the non-volatile memory blocks 210 of the user storage area 305 (e.g., the non-volatile memory blocks 210 that are assigned to the wear leveling pool 325).

In some implementations, the wear leveling algorithm includes a static wear leveling algorithm in which the non-volatile memory blocks 210 having the least amount of usage are used for a next write of data to the memory 140. In this way, the accumulation of access operations (e.g., write operations, read operations, program operations, and/or erase operations) is evenly incremented across the non-volatile memory blocks 210. The controller 130 (and/or the memory management component 250) may maintain a table or another type of database for tracking the accumulation of access operations for the non-volatile memory blocks 210 in the wear leveling pool 325.

In some implementations, the wear leveling algorithm includes a dynamic wear leveling algorithm. The dynamic wear leveling algorithm may be similar to the static wear leveling algorithm, except that the controller 130 additionally relocates data that is stored in relatively unused non-volatile memory blocks 210 (e.g., low usage non-volatile memory blocks 210 for which a frequency of access operations does not satisfy a threshold) to other non-volatile memory blocks 210 of the wear leveling pool 325. This enables the controller 130 to be used to store other (e.g., more frequently accessed and/or modified) data in the low usage non-volatile memory blocks 210 to increase the evenness of wearing in the wear leveling pool 325.

As further shown in FIG. 3, the controller 130 may allocate common spare blocks 330 to the user storage area 305. The common spare blocks 330 include non-volatile memory blocks 210 that are configured as spare memory blocks for the wear leveling pool 325. As non-volatile memory blocks 210 in the wear leveling pool 325 wear out or fail (e.g., due to premature failure or due to end of life), those non-volatile memory blocks 210 may be replaced with non-volatile memory blocks 210 from the common spare blocks 330. This enables the controller 130 to extend the useful life of the memory 140.

As indicated above, FIG. 3 is provided as an example. Other examples may differ from what is described with regard to FIG. 3.

Figure 4B:
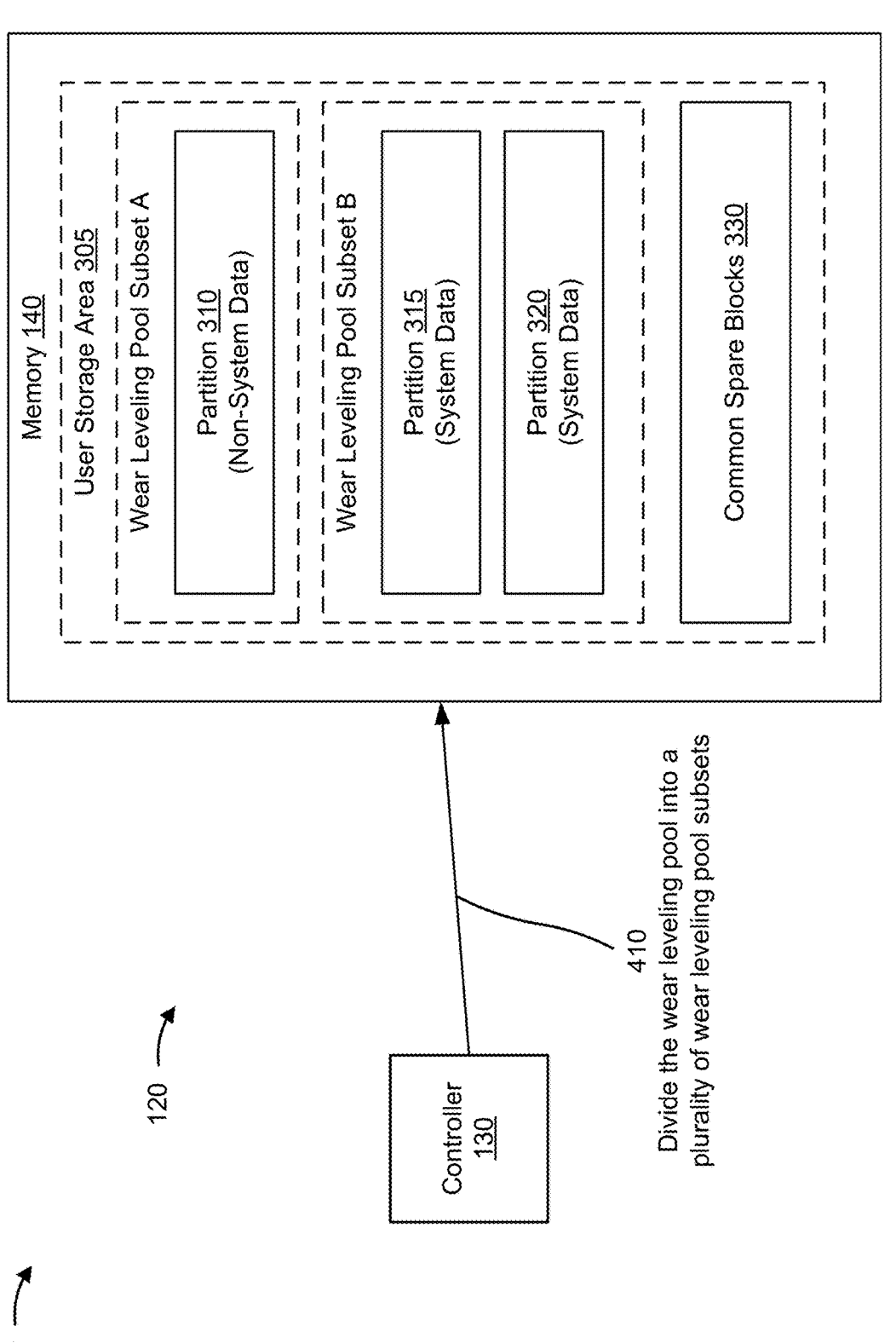

FIGS. 4A and 4B are diagrams illustrating an example 400 of memory device wear leveling. In particular, the example 400 includes an example in which the controller 130 divides, splits, and/or partitions the non-volatile memory blocks 210 of a wear leveling pool 325 into wear leveling pool subsets so that system data and/or other types of critical data may be stored in non-volatile memory blocks 210 that are isolated from being worn out by access operations for other types of data. As shown in FIGS. 4A and 4B, the example 400 may include the memory device 120, which includes the controller 130 and the memory 140. The controller 130 may access the memory 140 via the memory interface 160, as described herein.

As shown in FIG. 4A, at 405, the controller 130 (and/or the memory management component 250) may determine that one or more endurance parameters associated with a wear leveling pool 325 in a user storage area 305 satisfy a threshold. In some implementations, the controller 130 determines that an average quantity of erase cycles for the plurality of non-volatile memory blocks 210 of the wear leveling pool 325 satisfies a threshold quantity of erase cycles. For example, the controller 130 may determine that the average quantity of erase cycles for the plurality of non-volatile memory blocks 210 of the wear leveling pool 325 is equal to or greater than 2,700 erase cycles out of the 3,000 erase cycle rated life for the plurality of non-volatile memory blocks 210. In some implementations, the threshold quantity of erase cycles may be based on a percentage of the erase cycled rated life for the memory device 120, such as 90% (e.g., 2,700/3,000). However, other values are within the scope of the present disclosure. In some implementations, the controller 130 determines that a single non-volatile memory block 210 of the wear leveling pool 325 has accumulated the threshold quantity of erase cycles (e.g., rather than an average quantity of erase cycles across non-volatile memory blocks 210 satisfying the threshold). In some implementations, the controller 130 determines that a threshold quantity of non-volatile memory blocks 210 of the wear leveling pool 325 have accumulated the threshold quantity of erase cycles.

In some implementations, the controller 130 determines that an average remaining life for the plurality of non-volatile memory blocks 210 of the wear leveling pool 325 satisfies a threshold percentage. For example, the controller 130 may determine that the average remaining life for the plurality of non-volatile memory blocks 210 of the wear leveling pool 325 is equal to or less than approximately 10% remaining life for the plurality of non-volatile memory blocks 210. However, other values are within the scope of the present disclosure. In some implementations, the controller 130 determines that a single non-volatile memory block 210 of the wear leveling pool 325 satisfies the threshold percentage. In some implementations, the controller 130 determines that a threshold quantity of non-volatile memory blocks 210 of the wear leveling pool 325 satisfy the threshold percentage.

In some implementations, the controller 130 determines that an average used life for the plurality of non-volatile memory blocks 210 of the wear leveling pool 325 satisfies a threshold percentage. For example, the controller 130 may determine that the average used life for the plurality of non-volatile memory blocks 210 of the wear leveling pool 325 is equal to or greater than approximately 85% remaining life for the plurality of non-volatile memory blocks 210. However, other values are within the scope of the present disclosure. In some implementations, the controller 130 determines that a single non-volatile memory block 210 of the wear leveling pool 325 satisfies the threshold percentage. In some implementations, the controller 130 determines that a threshold quantity of non-volatile memory blocks 210 of the wear leveling pool 325 satisfy the threshold percentage.

In some implementations, the controller 130 determines that a quantity of available spare non-volatile memory blocks 210 (e.g., from the common spare blocks 330) for the wear leveling pool 325 satisfies a threshold quantity. For example, the controller 130 may determine that the quantity of available spare non-volatile memory blocks 210 in the common spare blocks 330 for the wear leveling pool 325 is equal to or less than approximately 1,000 available spare non-volatile memory blocks 210. However, other values are within the scope of the present disclosure. In some implementations, the controller 130 determines that a percentage of available spare non-volatile memory blocks 210 (e.g., from the common spare blocks 330) for the wear leveling pool 325 satisfies a threshold percentage. For example, the controller 130 may determine that the quantity of available spare non-volatile memory blocks 210 in the common spare blocks 330 for the wear leveling pool 325 is equal to or less than approximately 10% available spare non-volatile memory blocks 210. However, other values are within the scope of the present disclosure.

In some implementations, the thresholds and/or percentages described herein are configurable by the controller 130. For example, the controller 130 may configure a threshold quantity of erase operations (or another type of access operations), may configure a threshold percentage of remaining life, a threshold percentage of available spare non-volatile memory blocks 210, and/or may configure another configurable threshold. In some implementations, the threshold is configured or pre-configured for the controller 130. In implementations where the threshold is configurable by the controller 130, the controller 130 may determine or identify the threshold based on one or more parameters associated with the memory device 120, based on one or more attributes or requirements for the memory device 120, and/or based on another factor.

For example, the controller 130 may determine the threshold based on a junction temperature ($T_j$) of the memory device 120. The controller 130 may monitor the junction temperature of the memory device 120 over the operational life of the memory device 120 and may configure or adjust the threshold accordingly. The junction temperature (and operating temperature in general) for the memory device 120 may affect the aging of the memory device 120 and the likelihood of failure and/or performance degradation for the memory device 120. Greater junction temperatures for the memory device 120 may accelerate aging of the memory device 120, which may decrease the estimated life of the memory device 120, whereas lesser junction temperatures may slow the aging of the memory device 120. Similarly, greater junction temperatures for the memory device 120 may cause an increased error rate for the memory device 120 as the memory device ages, which may result in increased rates of data corruption and loss for the memory device 120, whereas lesser junction temperatures may reduce error rates for the memory device 120 as the memory device ages. Accordingly, the controller 130 may increase or decrease the threshold based on the historical operating temperature of the memory device 120 (e.g., as measured as the junction temperature).

As another example, the controller 130 may determine the threshold based on an end-of-life data retention parameter for the memory device 120. In some implementations, the memory device 120 may be rated to retain data for a particular duration at or near the EOL of the memory device 120 (or the memory cells of the memory device 120). The controller 130 may increase or decrease the threshold to increase the likelihood that the end-of-life data retention parameter will be satisfied for the memory device 120.

In some implementations, the controller 130 determines the threshold by identifying the threshold (e.g., the value for the threshold) in a look-up table based on the junction temperature, the end-of-life data retention parameter, and/or another parameter. In some implementations, the controller 130 determines the threshold by determining the threshold based on using the junction temperature, the end-of-life data retention parameter, and/or another parameter in an Arrhenius equation or another type of equation. The controller 130 may use the Arrhenius equation to determine the effects of junction temperature on charge de-trapping acceleration for the non-volatile memory blocks 210 of the memory device 120. Temperature affects have a greater impact on data retention as the non-volatile memory blocks 210 of the memory device 120 approach end of life (or wear out). The controller 130 may use the Arrhenius equation to model the effects of aging and data retention due to temperature. That way, the controller 130 may determine the threshold such that the storage behavior of the partitions for system data and other types of critical data is modified to avoid data retention defects.

In some implementations, the controller 130 uses a machine learning algorithm to estimate or predict when (e.g., a quantity of erase operations or remaining available common spare blocks 330) the memory cells of the non-volatile memory blocks 210 in the wear leveling pool 325 are to fail, and may configure the threshold accordingly.

As shown in FIG. 4B, at 410, the controller 130 (and/or the memory management component 250) may divide (or partition, split, and/or separate) the non-volatile memory blocks 210 of the wear leveling pool 325 into a plurality of wear leveling pool subsets. The controller 130 may configure each wear leveling pool subset such that each wear leveling pool subset includes a separate and/or different set of non-volatile memory blocks 210 from the wear leveling pool 325 and from each other.

The controller 130 may divide the non-volatile memory blocks 210 of the wear leveling pool 325 such that partitions that include system data and/or other types of critical data are stored and/or maintained in non-volatile memory blocks 210 in a separate wear leveling pool subset from non-system data and/or other types of non-critical data. For example, the partition 310 (which includes non-system data) may be stored in non-volatile memory blocks 210 of a wear leveling pool subset A (e.g., a first wear leveling pool subset), and the partitions 315 and 320 (which include system data) may be stored in non-volatile memory blocks 210 of a wear leveling pool subset B (e.g., a second wear leveling pool subset). In this way, the usage and wear of the non-volatile memory blocks 210 in the wear leveling pool subset A due to erase operations and/or other types of access operations for the non-system data do not affect the remaining life of the non-volatile memory blocks 210 in the wear leveling pool subset B for the system data.

In some implementations, the controller 130 identifies the non-volatile memory blocks 210 that are to be allocated to the wear leveling pool subsets that are to be used for storing system data and/or other critical data based on the estimated remaining life for the non-volatile memory blocks 210. For example, the controller 130 may identify the non-volatile memory blocks 210 that have the lowest estimated remaining life (e.g., less than or equal to a threshold) for allocation to the wear leveling pool subsets that are to be used for storing system data and/or other critical data. As another example, the controller 130 may identify the non-volatile memory blocks 210 that are to be allocated to the wear leveling pool subsets that are to be used for storying system data and/or other critical data based on respective quantities of erase cycles for each of non-volatile memory blocks 210 satisfying a threshold quantity of erase cycles. In this way, the non-volatile memory blocks 210 that have the greatest estimated remaining life may be allocated to wear leveling pools that are estimated to experience a greater amount of access operations to provide extended life for these wear leveling pools. As another example, the controller 130 may identify the non-volatile memory blocks 210 that have the greatest estimated remaining life (e.g., greater than or equal to a threshold) for allocation to the wear leveling pool subsets that are to be used for storing system data and/or other critical data. In this way, the non-volatile memory blocks 210 that have the greatest estimated remaining life may be allocated for storing system data and/or other critical data to increase the retention of the system data and/or other critical data.

In some implementations, the controller 130 may configure the non-volatile memory blocks 210 in the wear leveling pool subset B (and other wear leveling pool subsets that include system data and/or other critical data) as write protected to protect against additional wear and risk of data loss. In some implementations, the controller 130 may modify one or more parameters for the non-volatile memory blocks 210 in the wear leveling pool subset B (and other wear leveling pool subsets that include system data and/or other critical data) to further extend the life of the non-volatile memory blocks 210 and/or to reduce the likelihood of data loss for the partitions 315 and 320. For example, the controller 130 may modify one or more storage parameters, such as a data retention parameter, a maximum quantity of erase cycles, and/or an access time, among other examples. In some implementations, the controller 130 may increase a maximum quantity of erase cycles for the non-volatile memory blocks 210 and associated partitions in the wear leveling pool B and may increase an access time for the non-volatile memory blocks 210 and associated partitions in the wear leveling pool B to extend the remaining life of the non-volatile memory blocks 210.

As indicated above, FIGS. 4A and 4B are provided as an example. Other examples may differ from what is described with regard to FIGS. 4A and 4B.

Figure 5:
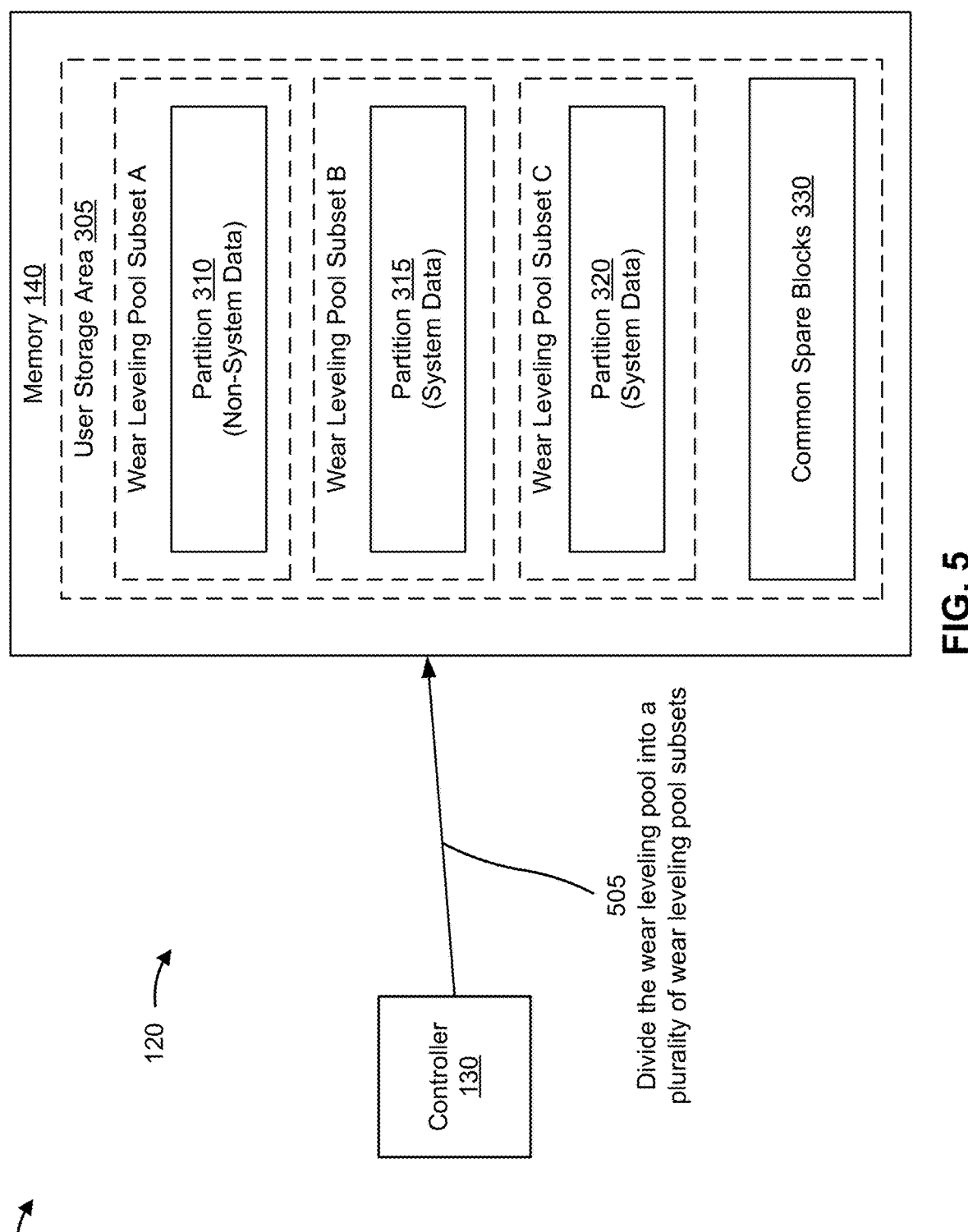

FIG. 5 is a diagram illustrating an example 500 of memory device wear leveling. As shown in FIG. 5, the example 500 may include the memory device 120, which includes the controller 130 and the memory 140. The controller 130 may access the memory 140 via the memory interface 160, as described herein.

The example 500 is similar to the example 400 described in connection with FIGS. 4A and 4B. However, in the example 500, the controller 130 divides, splits, and/or partitions the non-volatile memory blocks 210 of a wear leveling pool 325 into a plurality of wear leveling pool subsets such that at least a subset of partitions in the user storage area 305 are stored in non-volatile memory blocks 210 of separate and dedicated wear leveling pool subsets to further isolate the system data partitions and/or other types of critical partitions are isolated from data loss.

For example, the non-volatile memory blocks 210 of a wear leveling pool 325 may be divided, split, and/or partitioned into a wear leveling pool subset A (e.g., a first wear leveling pool subset), a wear leveling pool subset B (e.g., a second wear leveling pool subset), and a wear leveling pool subset C (e.g., a third wear leveling pool subset). The controller 130 may allocate separate groups of non-volatile memory blocks 210 to each of the wear leveling pool subsets.

As indicated above, FIG. 5 is provided as an example. Other examples may differ from what is described with regard to FIG. 5. For example, partitions of data in a user storage area may be divided, separated, split, and/or partitioned into other configurations of wear leveling pools to isolate at least a subset of partitions from being worn out by access operations for other types of data.

Figure 6:
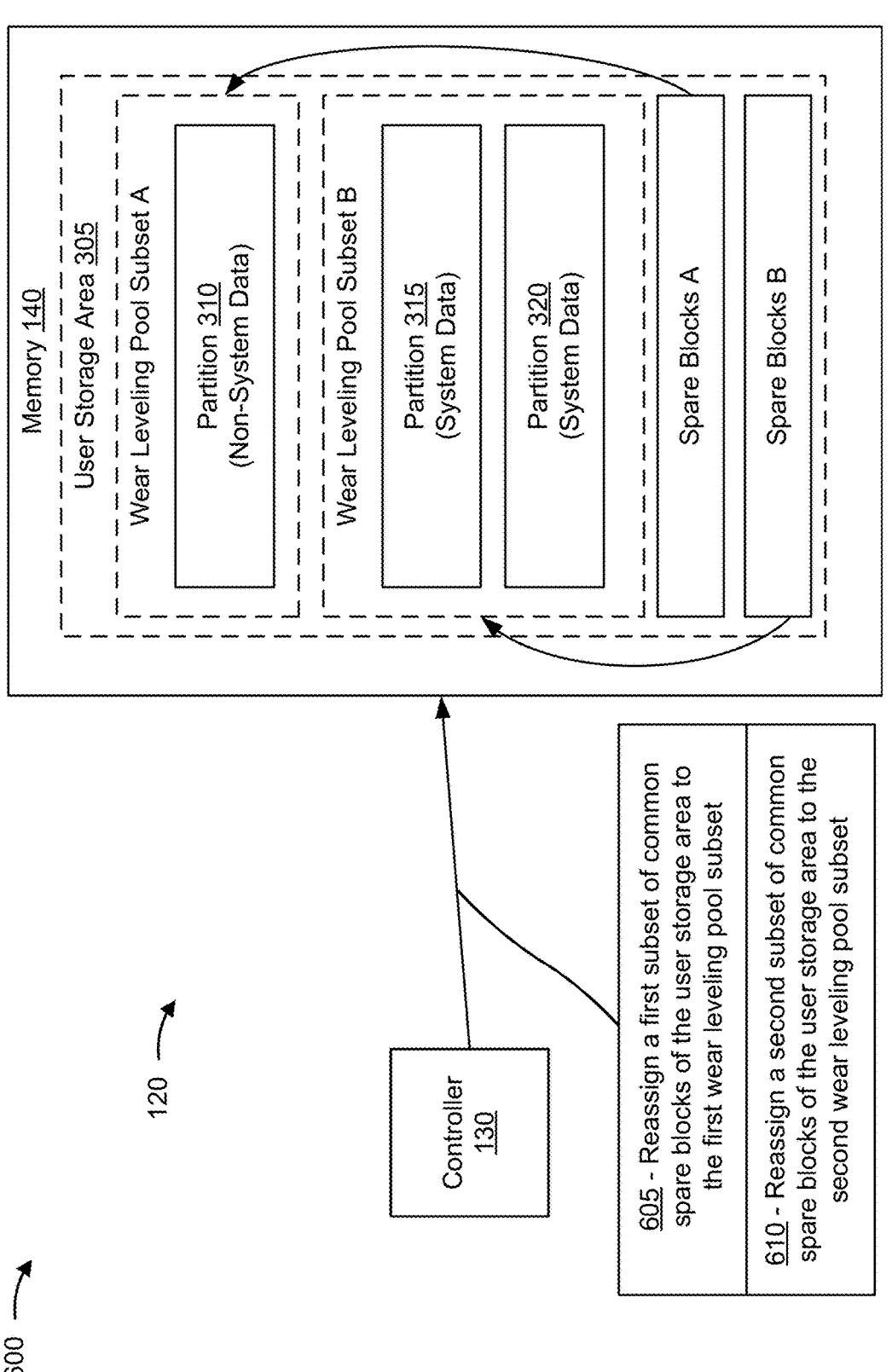

FIG. 6 is a diagram illustrating an example 600 of memory device wear leveling. In particular, the example 600 includes an example in which the controller 130 reallocates or reassigns respective subsets of non-volatile memory blocks 210 of the common spare blocks 330 for a wear leveling pool 325 to wear leveling pool subsets that are formed from the wear leveling pool 325. The operations described in connection with FIG. 6 may be performed in connection with one or more examples described herein, such as the example 400, the example 500, and/or the example 700 described in connection with FIGS. 7A-7C, among other examples. As shown in FIG. 6, the example 600 may include the memory device 120, which includes the controller 130 and the memory 140. The controller 130 may access the memory 140 via the memory interface 160, as described herein.

As shown in FIG. 6, at 605, the controller 130 (and/or the memory management component 250) may reassign a first subset of the common spare blocks 330 of the user storage area 305 to a first wear leveling pool subset (e.g., the wear leveling pool subset A). At 610, the controller 130 (and/or the memory management component 250) may reassign a second subset of the common spare blocks 330 of the user storage area 305 to a second wear leveling pool subset (e.g., the wear leveling pool subset B).

In some implementations, the controller 130 may reassign the subsets of the common spare blocks 330 based on dividing the wear leveling pool 325 into the wear leveling pool subsets. In some implementations, the controller 130 may reassign the subsets of the common spare blocks 330 based on determining that one or more endurance parameters for the non-volatile memory blocks 210 of the wear leveling pool 325 satisfy a threshold, as described above in connection with FIG. 4A.

In some implementations, the controller 130 reassigns a greater quantity of non-volatile memory blocks 210 of the common spare blocks 330 to the wear leveling pool subset(s) that are configured for storing system data and/or other critical data relative to the quantity of non-volatile memory blocks 210 of the common spare blocks 330 reassigned to the wear leveling pool subset(s) that are configured for storing non-system data and/or other non-critical data. The greater quantity of non-volatile memory blocks 210 of the common spare blocks 330 may be reassigned to the wear leveling pool subset(s) that are configured for storing system data and/or other critical data to extend the remaining life of the wear leveling pool subset(s) that are configured for storing system data and/or other critical data.

As indicated above, FIG. 6 is provided as an example. Other examples may differ from what is described with regard to FIG. 6.

Figure 7A:
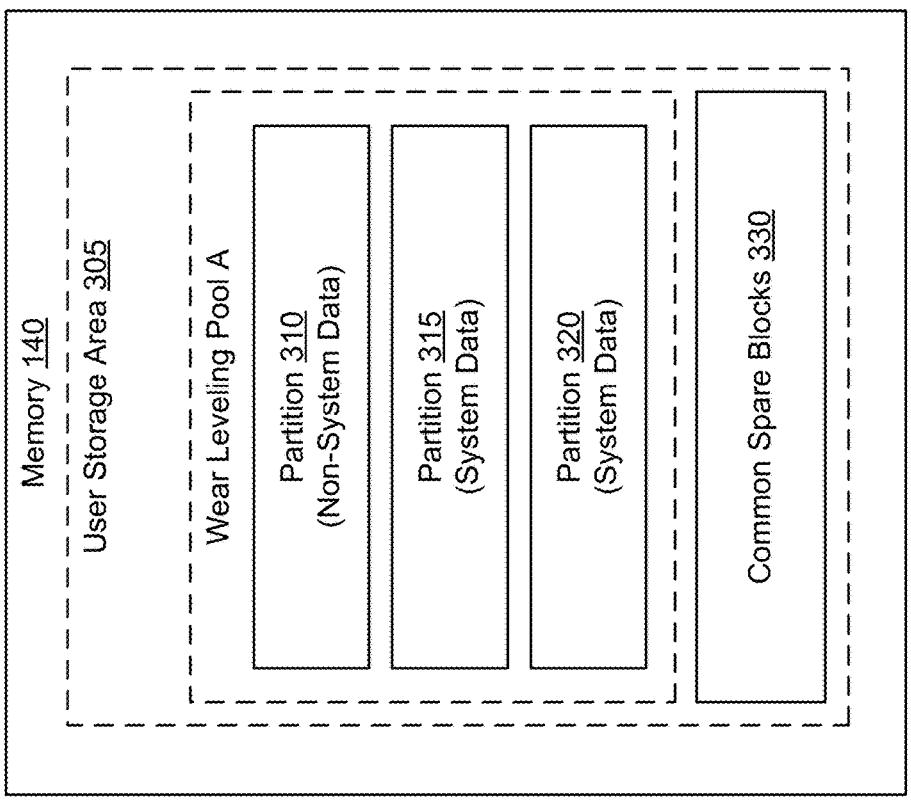
Figure 7B:
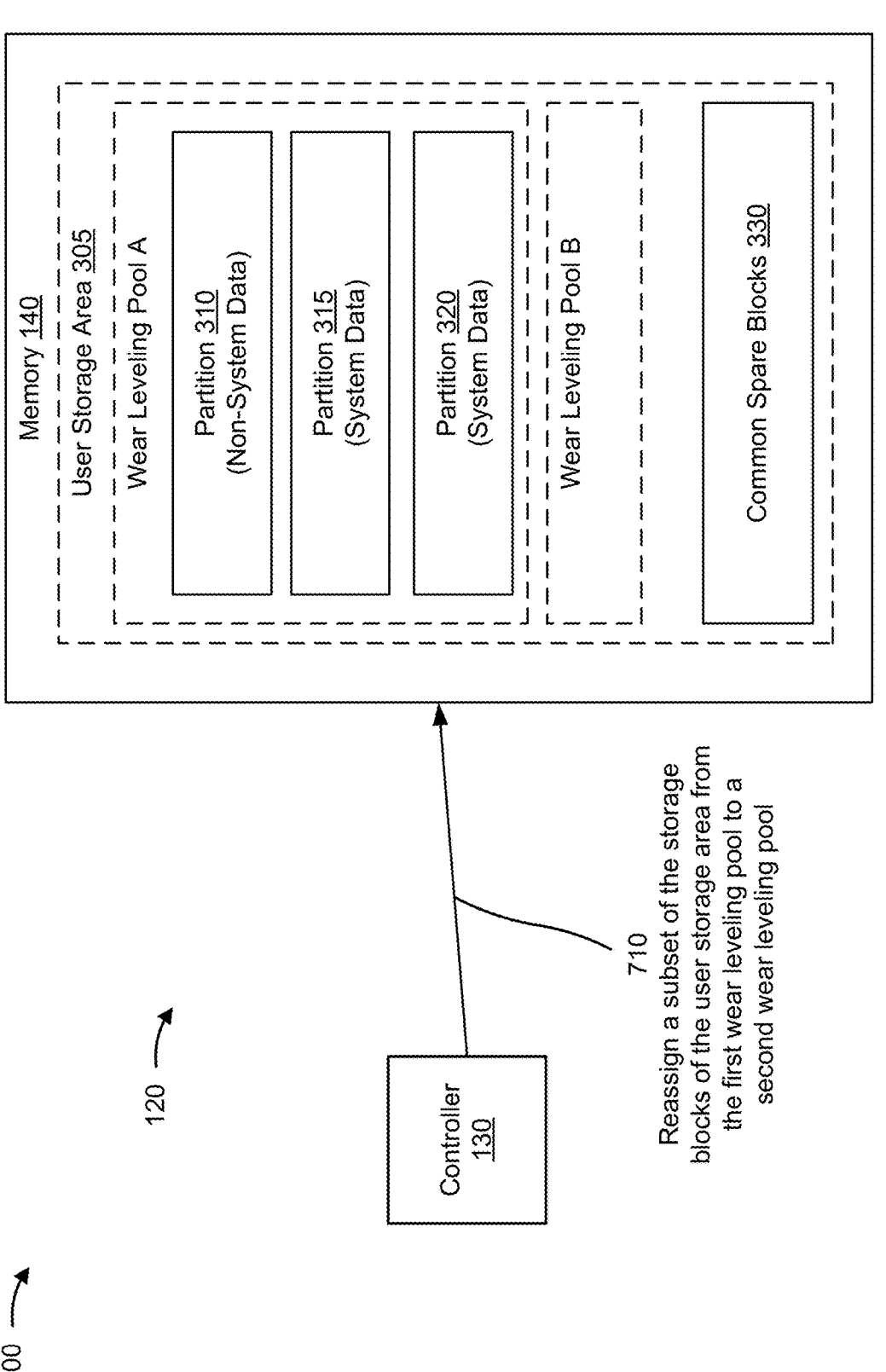
Figure 7C:
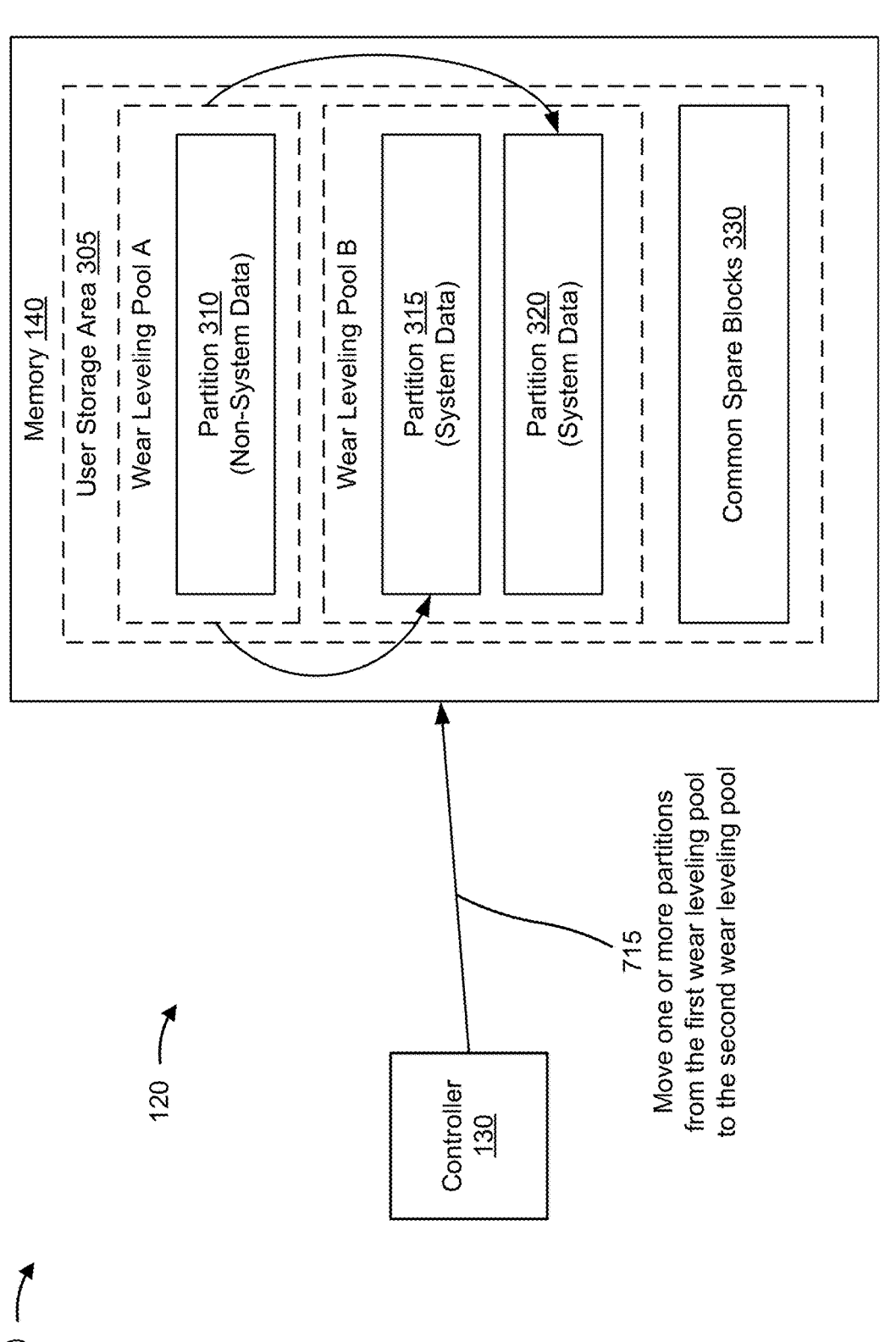

FIGS. 7A-7C are diagrams illustrating an example 700 of memory device wear leveling. In particular, the example 700 includes an example in which the controller 130 reassigns a subset of the plurality of non-volatile memory blocks 210 of a first wear leveling pool (e.g., a wear leveling pool A) to a second wear leveling pool (e.g., a wear leveling pool B) in the user storage area 305 of the memory device 120, and moves one or more partitions from the first wear leveling pool to the second wear leveling pool so that system data and/or other types of critical data may be stored in non-volatile memory blocks 210 that are isolated from being worn out by access operations for other types of data. As shown in FIGS. 7A-7C, the example 700 may include the memory device 120, which includes the controller 130 and the memory 140. The controller 130 may access the memory 140 via the memory interface 160, as described herein.

As shown in FIG. 7A, at 705, the controller 130 (and/or the memory management component 250) may determine that one or more endurance parameters associated with the wear leveling pool A in the user storage area 305 satisfy a threshold. The controller 130 may determine that one or more endurance parameters associated with the wear leveling pool A in a user storage area 305 satisfy a threshold in a similar manner as described above in connection with FIG. 4A.

As shown in FIG. 7B, at 710, the controller 130 (and/or the memory management component 250) may reassign, based on determining that the one or more endurance parameters satisfy the threshold, a subset of the non-volatile memory blocks 210 of the wear leveling pool A to the wear leveling pool B in the user storage area 305 of the memory device 120. In this way, the controller 130 maintains the wear leveling pool A and reduces the size of the wear leveling pool A in order to reassign the subset of the non-volatile memory blocks 210 of the wear leveling pool A to the wear leveling pool B (e.g., as opposed to creating all new wear leveling pool subsets from an original wear leveling pool).

Additionally, or alternatively, the controller 130 may reassign, based on determining that the one or more endurance parameters satisfy the threshold, a subset of non-volatile memory blocks 210 of another wear leveling pool of the memory device 120 to the wear leveling pool B. In some implementations, the controller 130 generates and/or configures the wear leveling pool B based on determining that the one or more endurance parameters satisfy the threshold.

As shown in FIG. 7C, at 715, the controller 130 (and/or the memory management component 250) may move one or more partitions from the wear leveling pool A to the wear leveling pool B. In particular, the controller 130 may move the one or more partitions from the non-volatile memory blocks 210 of the wear leveling pool A to the non-volatile memory blocks 210 of the wear leveling pool B. The controller 130 may move the one or more partitions such that partitions that include non-system data and/or other non-critical data (e.g., the partition 310) and partitions that include system data and/or other critical data (e.g., the partitions 315 and 320) are stored in separate wear leveling pools.

In some implementations, the controller 130 identifies the one or more partitions that are to be moved to the wear leveling pool B based on the one or more partitions being preconfigured to be moved to the wear leveling pool B when the controller 130 determines that the one or more endurance parameters satisfy the threshold. For example, the controller 130 may configure metadata for the one or more partitions to indicate that the one or more partitions are to be moved to the wear leveling pool B when the controller 130 determines that the one or more endurance parameters satisfy the threshold.

In some implementations, the controller 130 identifies the one or more partitions that are to be moved to the wear leveling pool B based on one or more data types stored in the one or more partitions. For example, the controller 130 may identify partitions that include system data and/or other critical data for movement to the wear leveling pool B. As another example, the controller 130 may identify partitions that include non-system data and/or other non-critical data for movement to the wear leveling pool B.

As indicated above, FIGS. 7A-7C are provided as an example. Other examples may differ from what is described with regard to FIGS. 7A-7C.

FIG. 8 is a flowchart of an example method 800 associated with memory device wear leveling. In some implementations, a memory device (e.g., the memory device 120) may perform or may be configured to perform one or more process blocks of FIG. 8. Additionally, or alternatively, one or more components of the memory device (e.g., the controller 130 and/or the memory management component 250) may perform or may be configured to perform one or more process blocks of FIG. 8.

As shown in FIG. 8, the method 800 may include determining that an endurance parameter associated with a wear leveling pool of the memory satisfies a threshold, wherein the wear leveling pool includes a plurality of memory blocks of the memory (block 810). As further shown in FIG. 8, the method 800 may include dividing, based on determining that the endurance parameter satisfies the threshold, the plurality of memory blocks of the wear leveling pool into a first wear leveling pool subset that includes a first subset of the plurality of memory blocks and a second wear leveling pool subset that includes a second subset of the plurality of memory blocks, wherein a first subset of a plurality of data partitions is stored in the first subset of the plurality of memory blocks of the first wear leveling pool subset, and wherein a second subset of the plurality of data partitions is stored in the second subset of the plurality of memory blocks of the second wear leveling pool subset (block 820).

Although FIG. 8 shows example blocks of a method 800, in some implementations, the method 800 may include additional blocks, fewer blocks, different blocks, or differently arranged blocks than those depicted in FIG. 8. Additionally, or alternatively, two or more of the blocks of the method 800 may be performed in parallel. The method 800 is an example of one method that may be performed by one or more devices described herein. These one or more devices may perform or may be configured to perform one or more other methods based on operations described herein, such as the operations described in connection with FIGS. 3, 4A-4B, 5, 6, and/or 7A-7C.

FIG. 9 is a flowchart of an example method 900 associated with memory device wear leveling. In some implementations, a memory device (e.g., the memory device 120) may perform or may be configured to perform one or more process blocks of FIG. 9. Additionally, or alternatively, one or more components of the memory device (e.g., the controller 130 and/or the memory management component 250) may perform or may be configured to perform one or more process blocks of FIG. 9.

As shown in FIG. 9, the method 900 may include determining that an endurance parameter associated with a plurality of memory blocks of a first wear leveling pool of the memory satisfies a threshold (block 910). As further shown in FIG. 9, the method 900 may include reassigning, based on determining that the endurance parameter satisfies the threshold, a subset of the plurality of memory blocks of the first wear leveling pool to a second wear leveling pool of the memory device (block 920). As further shown in FIG. 9, the method 900 may include moving one or more partitions from the first wear leveling pool to the second wear leveling pool (block 930).

Although FIG. 9 shows example blocks of a method 900, in some implementations, the method 900 may include additional blocks, fewer blocks, different blocks, or differently arranged blocks than those depicted in FIG. 9. Additionally, or alternatively, two or more of the blocks of the method 900 may be performed in parallel. The method 900 is an example of one method that may be performed by one or more devices described herein. These one or more devices may perform or may be configured to perform one or more other methods based on operations described herein, such as the operations described in connection with FIGS. 3, 4A-4B, 5, 6, and/or 7A-7C.

FIG. 10 is a flowchart of an example method 1000 associated with memory device wear leveling. In some implementations, a memory device (e.g., the memory device 120) may perform or may be configured to perform one or more process blocks of FIG. 10. Additionally, or alternatively, one or more components of the memory device (e.g., the controller 130 and/or the memory management component 250) may perform or may be configured to perform one or more process blocks of FIG. 10.

As shown in FIG. 10, the method 1000 may include determining that an endurance parameter associated with a wear leveling pool of the memory device satisfies a threshold (block 1010). As further shown in FIG. 10, the method 1000 may include dividing, based on determining that the endurance parameter satisfies the threshold, a plurality of memory blocks of the wear leveling pool into a first wear leveling pool subset that includes a first subset of the plurality of memory blocks and a second wear leveling pool subset that includes a second subset of the plurality of memory blocks (block 1020). As further shown in FIG. 10, the method 1000 may include reassigning, based on determining that the endurance parameter satisfies the threshold, a first subset of common spare memory blocks to the first wear leveling pool (block 1030). As further shown in FIG. 10, the method 1000 may include reassigning, based on determining that the endurance parameter satisfies the threshold, a second subset of the common spare memory blocks to the second wear leveling pool (block 1040).

Although FIG. 10 shows example blocks of a method 1000, in some implementations, the method 1000 may include additional blocks, fewer blocks, different blocks, or differently arranged blocks than those depicted in FIG. 10. Additionally, or alternatively, two or more of the blocks of the method 1000 may be performed in parallel. The method 1000 is an example of one method that may be performed by one or more devices described herein. These one or more devices may perform or may be configured to perform one or more other methods based on operations described herein, such as the operations described in connection with FIGS. 3, 4A-4B, 5, 6, and/or 7A-7C.

In some implementations, a memory device includes a memory and a controller. The controller is configured to determine that an endurance parameter associated with a wear leveling pool of the memory satisfies a threshold. The wear leveling pool includes a plurality of memory blocks of the memory. The controller is configured to divide, based on determining that the endurance parameter satisfies the threshold, the plurality of memory blocks of the wear leveling pool into a first wear leveling pool subset that includes a first subset of the plurality of memory blocks and a second wear leveling pool subset that includes a second subset of the plurality of memory blocks. A first subset of a plurality of data partitions is stored in the first subset of the plurality of memory blocks of the first wear leveling pool subset. A second subset of the plurality of data partitions is stored in the second subset of the plurality of memory blocks of the second wear leveling pool subset.

In some implementations, a memory device includes a memory and a controller. The controller is configured to determine that an endurance parameter associated with a plurality of memory blocks of a first wear leveling pool of the memory satisfies a threshold. The controller is configured to reassign, based on determining that the endurance parameter satisfies the threshold, a subset of the plurality of memory blocks of the first wear leveling pool to a second wear leveling pool of the memory device. The controller is configured to move one or more partitions from the first wear leveling pool to the second wear leveling pool.

In some implementations, a method includes determining, by a controller of a memory device, that an endurance parameter associated with a wear leveling pool of the memory device satisfies a threshold. The method includes dividing, by the controller and based on determining that the endurance parameter satisfies the threshold, a plurality of memory blocks of the wear leveling pool into a first wear leveling pool subset that includes a first subset of the plurality of memory blocks and a second wear leveling pool subset that includes a second subset of the plurality of memory blocks. The method includes reassigning, by the controller and based on determining that the endurance parameter satisfies the threshold, a first subset of common spare memory blocks to the first wear leveling pool. The method includes reassigning, by the controller and based on determining that the endurance parameter satisfies the threshold, a second subset of the common spare memory blocks to the second wear leveling pool.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
a plurality of memory blocks; and
a controller coupled with the plurality of memory blocks, the controller configured to:
separate the plurality of memory blocks into a first subset and a second subset based at least in part on a parameter, corresponding to an average value for the plurality of memory blocks or corresponding to a quantity of memory blocks within a third subset of the plurality of memory blocks, being indicative of an end of life of the plurality of memory blocks,
wherein the first subset of the plurality of memory blocks corresponds to a first wear leveling pool subset and is configured to store a first type of data, and
wherein the second subset of the plurality of memory blocks corresponds to a second wear leveling pool subset and is configured to store a second type of data.

2. The memory device of claim 1, wherein the parameter is indicative of the end of life of the plurality of memory blocks based at least in part on the parameter satisfying a threshold.

3. The memory device of claim 2, wherein:
the third subset of the plurality of memory blocks are configured as spare memory blocks; and
the parameter comprises the quantity of memory blocks in the third subset.

4. The memory device of claim 3, wherein the controller is further configured to:
determine that the quantity of memory blocks in the third subset satisfies the threshold based at least in part on the quantity of memory blocks in the third subset being equal to or less than the threshold, wherein allocating the memory blocks is based at least in part on the determining.

5. The memory device of claim 3, wherein the controller is further configured to:
reassign one or more memory blocks from the third subset to the first subset or the second subset.

6. The memory device of claim 2, wherein the parameter comprises an average quantity of erase operations for the plurality of memory blocks.

7. The memory device of claim 6, wherein the controller is further configured to:
determine that the average quantity of erase operations for the plurality of memory blocks satisfies the threshold, wherein allocating the memory blocks is based at least in part on the determining.

8. The memory device of claim 2, wherein the controller configures the threshold based at least in part on a temperature of the memory device, a data retention parameter for the memory device, or both.

9. The memory device of claim 1, wherein the second subset is configured as write protected.

10. The memory device of claim 1, wherein:
the first type of data comprises non-system data associated with a host device; and
the second type of data comprises system data associated with the host device.

11. The memory device of claim 1, wherein the plurality of memory blocks correspond to a wear leveling pool.

12. A memory device, comprising:

a plurality of memory blocks comprising:

a first subset of the plurality of memory blocks configured to store a first subset of a plurality of data partitions, and a second subset of the plurality of memory blocks configured to store a second subset of the plurality of data partitions; and a controller coupled with the plurality of memory blocks, the controller configured to:

reassign one or more of the plurality of memory blocks from the first subset to the second subset;

move one or more data partitions from the first subset to the second subset based at least in part on the reassigning and based at least in part on a first parameter associated with the plurality of memory blocks being indicative of an end of life of the plurality of memory blocks; and modify one or more second parameters for the one or more data partitions on the second subset.

13. The memory device of claim 12, wherein reassigning the one or more of the plurality of memory blocks from the first subset to the second subset is based at least in part on the first parameter being indicative of the end of life of the plurality of memory blocks.

14. The memory device of claim 12, wherein:

the plurality of memory blocks further comprises a third subset of the plurality of memory blocks configured as spare memory blocks;

the first parameter comprises a quantity of memory blocks in the third subset; and the first parameter is indicative of the end of life of the plurality of memory blocks based at least in part on the quantity of memory blocks in the third subset satisfying a threshold.

15. The memory device of claim 12, wherein:

the first parameter comprises an average quantity of erase operations for the plurality of memory blocks; and the first parameter is indicative of the end of life of the plurality of memory blocks based at least in part on the average quantity of erase operations for the plurality of memory blocks satisfying a threshold.

16. The memory device of claim 12, wherein the one or more second parameters comprise:

a data retention parameter;

a maximum quantity of erase cycles; or an access time.

17. A memory device, comprising:

a plurality of memory blocks comprising:

a first subset of the plurality of memory blocks configured to store a first subset of a plurality of data partitions, a second subset of the plurality of memory blocks configured to store a second subset of the plurality of data partitions, and a third subset of the plurality of memory blocks configured as spare memory blocks; and a controller coupled with the plurality of memory blocks, the controller configured to:

reallocate a first quantity of the spare memory blocks from the third subset to the first subset, and reallocate a second quantity of the spare memory blocks from the third subset to the second subset.

18. The memory device of claim 17, wherein the controller is further configured to reallocate the first quantity of the spare memory blocks and the second quantity of the spare memory blocks based at least in part on a parameter associated with the plurality of memory blocks being indicative of an end of life of the plurality of memory blocks.

19. The memory device of claim 18, wherein:

the parameter comprises a quantity of memory blocks in the third subset; and the parameter is indicative of the end of life of the plurality of memory blocks based at least in part on the quantity of memory blocks in the third subset satisfying a threshold.

20. The memory device of claim 18, wherein:

the parameter comprises an average quantity of erase operations for the plurality of memory blocks; and the parameter is indicative of the end of life of the plurality of memory blocks based at least in part on the average quantity of erase operations for the plurality of memory blocks satisfying a threshold.

* * * * *